(12) United States Patent
Schmitt

(10) Patent No.: US 11,519,941 B2
(45) Date of Patent: Dec. 6, 2022

(54) CURRENT SENSING DEVICE HAVING AN INTEGRATED ELECTRICAL SHIELD

(71) Applicant: Analog Devices International Unlimited Company, County Limerick (IE)

(72) Inventor: Jochen Schmitt, Biedenkopf (DE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/939,325

(22) Filed: Jul. 27, 2020

(65) Prior Publication Data

US 2022/0026469 A1    Jan. 27, 2022

(51) Int. Cl.

| | |
|---|---|
| *G01R 15/20* | (2006.01) |
| *G01R 33/09* | (2006.01) |
| *G01R 19/00* | (2006.01) |
| *G01R 33/00* | (2006.01) |

(52) U.S. Cl.
CPC ......... *G01R 15/207* (2013.01); *G01R 15/205* (2013.01); *G01R 19/0092* (2013.01); *G01R 33/0052* (2013.01); *G01R 33/0076* (2013.01); *G01R 33/093* (2013.01); *G01R 33/096* (2013.01); *G01R 33/098* (2013.01)

(58) Field of Classification Search
CPC ............................. G01R 15/207; G01R 15/205; G01R 19/0092; G01R 33/0052; G01R 33/0076; G01R 33/093; G01R 33/096; G01R 33/098

See application file for complete search history.

(56) References Cited

U.S. PATENT DOCUMENTS

| | | |
|---|---|---|
| 3,820,110 A | 6/1974 | Henrich et al. |
| 4,451,812 A | 5/1984 | Vescovi et al. |
| 5,218,173 A | 6/1993 | Garwin et al. |

(Continued)

FOREIGN PATENT DOCUMENTS

| | | |
|---|---|---|
| DE | 102008034577 A1 | 2/2010 |
| DE | 102011005994 B4 | 9/2011 |

(Continued)

*Primary Examiner* — Feba Pothen
(74) *Attorney, Agent, or Firm* — Knobbe, Martens, Olsen and Bear, LLC

(57) ABSTRACT

The present invention relates to apparatuses and methods for measuring electrical currents. A measurement circuit is electrically separated from a primary conductor through which the current to be measured flows. An indirect coupling between the primary conductor and the measurement circuit is achieved by magnetic coupling. The magnetic field created by the current is detected by a magnetic field sensor, which forms part of the measurement circuit. To avoid unwanted capacitive coupling, according to at least some embodiments, an electrical shield is placed between the primary conductor and the measurement circuit. In some embodiments, a differential magnetic field sensor is placed in proximity to two opposite segments of the primary conductors to achieve differential sensing. The disclosed circuits are particularly useful in the design and manufacturing of highly integrated sensors, such as a sensors integrated into a single chip package, and can be used for PWM controlled currents.

20 Claims, 9 Drawing Sheets

(56) References Cited

U.S. PATENT DOCUMENTS

| | | | |
|---|---|---|---|
| 5,343,143 A | 8/1994 | Voisine et al. | |
| 6,414,475 B1 | 7/2002 | Dames et al. | |
| 7,728,680 B2 | 6/2010 | Thalheim et al. | |
| 7,746,056 B2 | 6/2010 | Stauth et al. | |
| 7,916,501 B2 | 3/2011 | Free et al. | |
| 8,080,994 B2 | 12/2011 | Taylor et al. | |
| 8,692,546 B2 | 4/2014 | Cesaretti et al. | |
| 8,760,149 B2 | 6/2014 | Ausserlechner | |
| 8,779,757 B2 | 7/2014 | Ausserlechner | |
| 9,052,785 B2 | 6/2015 | Horie | |
| 9,176,170 B2 | 11/2015 | Racz | |
| 9,869,729 B1 | 1/2018 | Ausserlechner | |
| 10,088,505 B2 | 10/2018 | Okuyama et al. | |
| 10,105,811 B2 | 10/2018 | Miller et al. | |
| 10,352,969 B2 | 7/2019 | Milano et al. | |
| 2002/0024109 A1 | 2/2002 | Hayat-Dawoodi | |
| 2007/0279053 A1* | 12/2007 | Taylor | G01R 15/207 324/252 |
| 2011/0001587 A1* | 1/2011 | Sutardja | H03H 2/00 333/24 R |
| 2014/0062469 A1* | 3/2014 | Yang | G01C 17/28 324/247 |
| 2016/0169940 A1 | 6/2016 | Ausserlechner | |
| 2018/0143269 A1* | 5/2018 | Deak | G01R 33/0052 |
| 2018/0149677 A1* | 5/2018 | Milano | G01R 19/0092 |
| 2018/0149713 A1* | 5/2018 | Latham | G01R 15/202 |
| 2018/0323170 A1* | 11/2018 | Kim | H01L 25/50 |
| 2019/0014696 A1 | 1/2019 | Choi et al. | |
| 2019/0148988 A1 | 5/2019 | Hwang et al. | |
| 2019/0187183 A1 | 6/2019 | Okuyama et al. | |
| 2020/0174043 A1* | 6/2020 | Liu | G01R 15/202 |

FOREIGN PATENT DOCUMENTS

| | | |
|---|---|---|
| KR | 101272239 B1 | 5/2013 |
| KR | 101847011 B1 | 11/2017 |
| WO | WO 2014/137012 A1 | 9/2014 |

\* cited by examiner

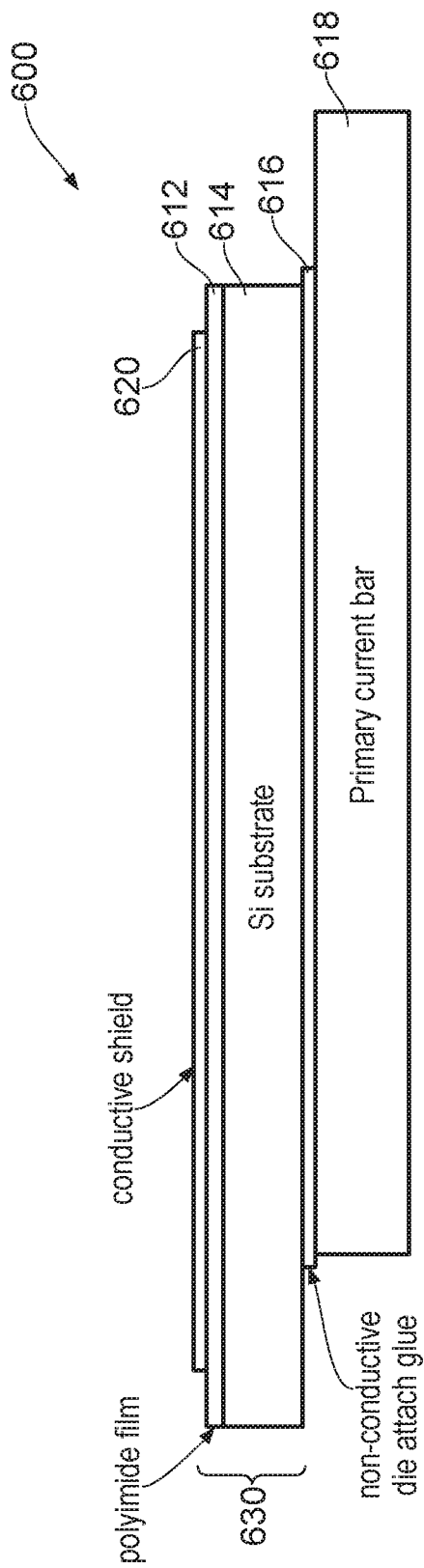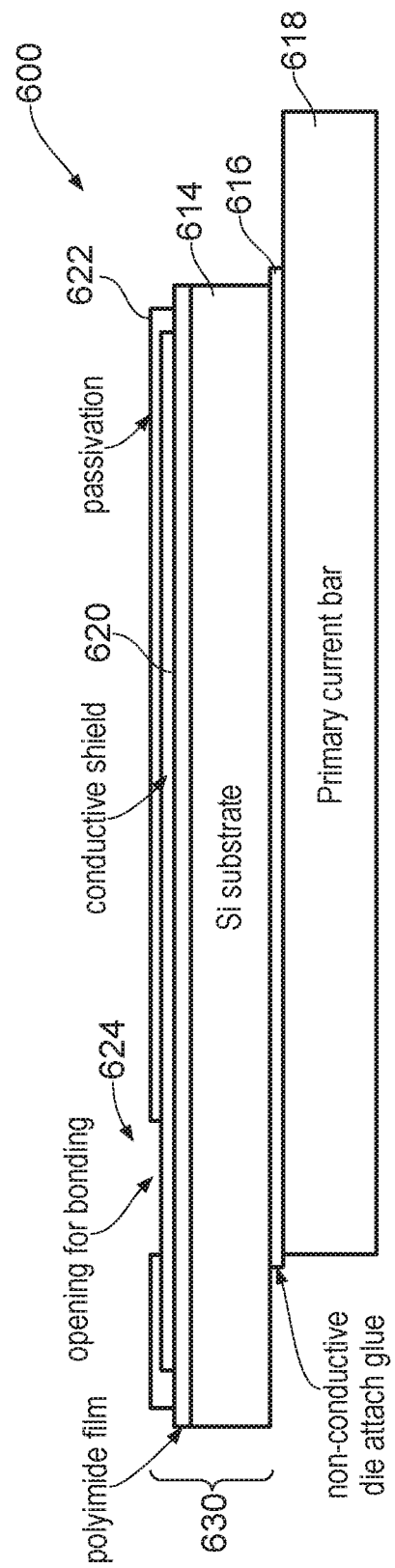
FIG. 6A
FIG. 6B

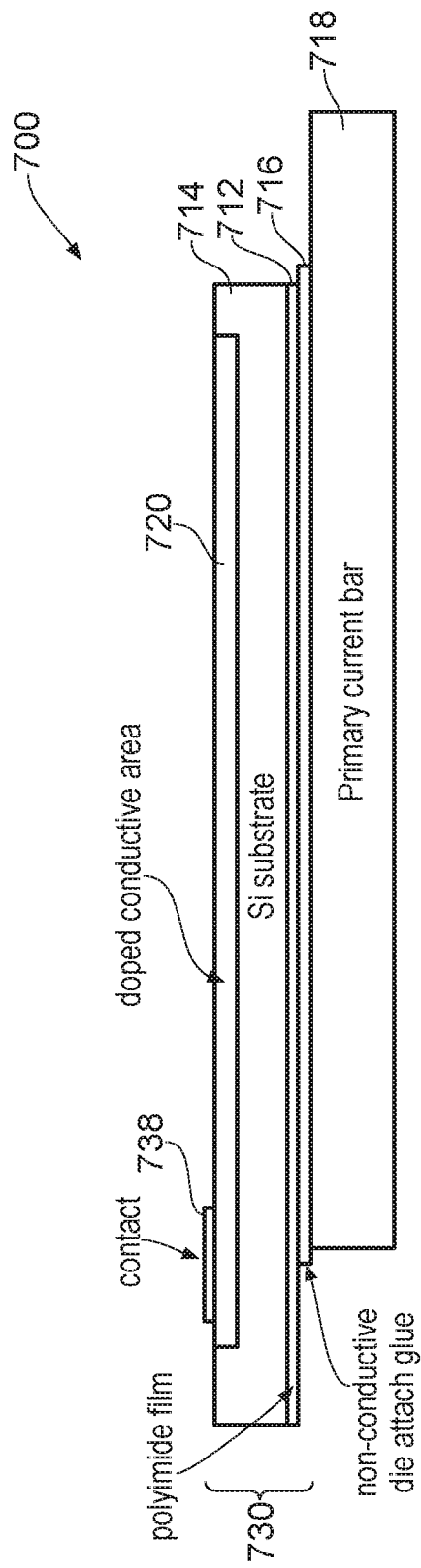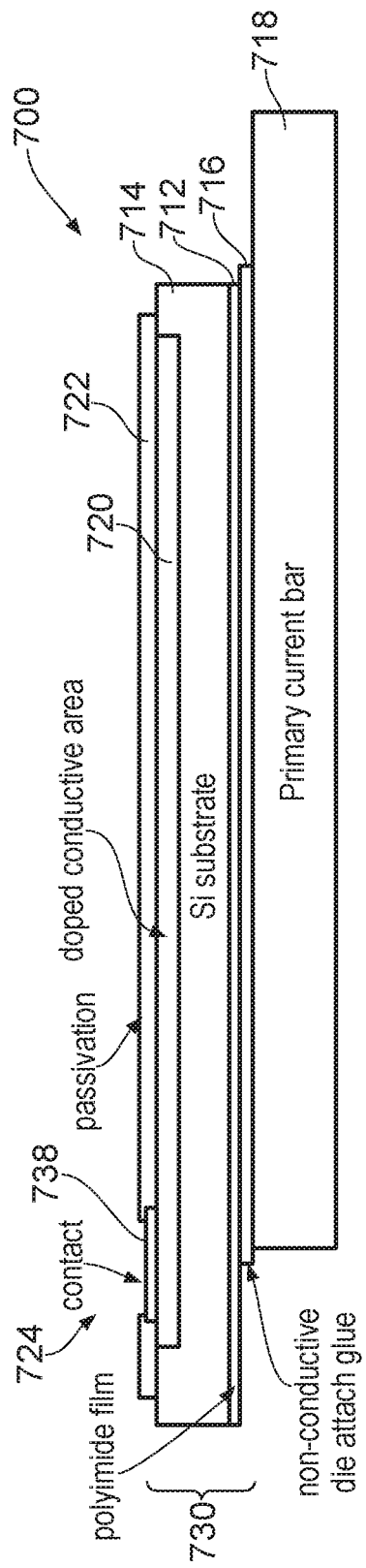
FIG. 7A
FIG. 7B

CURRENT SENSING DEVICE HAVING AN INTEGRATED ELECTRICAL SHIELD

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

TECHNICAL FIELD

The disclosure relates to devices, systems and methods useful for detecting and measuring electrical currents. In particular, it relates to integrated devices suitable for measuring electrical occurrence having relatively steep voltage jumps, such as pulse width modulated (PWM) currents. The disclosure also relates to methods for manufacturing such devices.

BACKGROUND

Many applications require the presence and size of an electrical current to be measured or monitored. Among those applications are drive control circuits, which control the speed or power of an electrical motor or other electrical current consumer, and which require the monitoring of a supplied electrical power. Other applications include measurement circuits, in which the size of an unknown, incoming current is to be measured. For example, an electrical current generated by a solar cell or wind turbine can be measured to assess its performance. In general sensing systems, a sensor, also called transducer, which responds to an external physical condition, such as temperature, movement, light or other radiation, may provide an electrical current proportional to the monitored physical condition. The electrical current is then measured and converted, for example to the voltage domain or digital domain, for further processing.

Many different devices and circuits for measuring electrical currents are known from the prior art. A common approach involves the use of a sense resistor, which is coupled in series with an electrical pathway carrying the current to be measured. Based on Ohm's law, $U=R \cdot I$, one can then determine the current in the electrical pathway based on a voltage difference or voltage drop between two terminals of the sense resistor. However, this approach is limited in its application in that it requires the insertion of the sense resistor directly into the electrical pathway to be monitored and also leads to a direct electrical connection between the measurement circuit and the primary circuit, whose current is to be measured.

Other approaches are based on sensors detecting the strength and/or orientation of magnetic fields, i.e., magnetometers. A current flowing through an electric conductor will generator a magnetic field surrounding the conductor. The strength and orientation of the magnetic field is proportional to the size and perpendicular to the direction of the current flowing through the conductor.

SUMMARY

Hence, magnetic field sensors arranged in proximity to the conductor may be used to determine the strength of a current flowing through the conductor. Among other, such approaches have the advantage that the measurement circuit and the conductor, through which the current to be measured flows, are electrically isolated from each other, i.e., there is a galvanic isolation barrier between the primary circuit and the measurement circuit. Also, no additional component needs to be inserted into the primary electrical circuit carrying the current to be measured.

The present invention relates to apparatuses and methods for measuring electrical currents. A measurement circuit is electrically separated from a primary conductor through which the current to be measured flows. An indirect coupling between the primary conductor and the measurement circuit is achieved by magnetic coupling. The magnetic field created by the current is detected by a magnetic field sensor, which forms part of the measurement circuit. To avoid unwanted capacitive coupling, according to at least some embodiments, an electrical shield is placed between the primary conductor and the measurement circuit. In some embodiments, a differential magnetic field sensor is placed in proximity to two opposite segments of the primary conductors to achieve differential sensing. The disclosed circuits are particularly useful in the design and manufacturing of highly integrated sensors, such as a sensors integrated into a single chip package, and can be used for PWM controlled currents.

According to one embodiment of the disclosure a chip sensor package is provided. The package includes a lead frame, a differential magnetic field sensor, and an electrical shield placed between the lead frame and the differential magnetic field sensor. The lead frame comprises a metal trace for carrying a current from a first terminal to a second terminal, the metal trace comprising a first conductive section for carrying the current in a first direction and a second conductive section for carrying the current in a second direction, the second direction being opposite to the first direction. The differential magnetic field sensor is placed in a layer of the sensor package above the lead frame and comprises a first sensing area associated with the first conductive section and a second sensing area associated with the second conductive section.

According to another embodiment of the disclosure, a method of manufacturing an integrated sensor device is disclosed. The method comprises the steps of: providing a primary current bar in a base layer, the primary current bar having at least two antiparallel segments; providing an insulation layer comprising an insulating film, the insulation layer being arranged above the base layer in a stacking direction; providing an electrical shield in a shielding layer, the shielding layer being arranged above the base layer and the insulation layer in the stacking direction, the electrical shield being isolated from the primary current bar by the insulation film; and providing a differential magnetic field sensor in a sensing layer, the sensing layer being arranged above the base layer, the insulation layer and the shielding layer in the stacking direction, the differential magnetic field sensor being arranged on the opposite side of the electrical shield with respect to the primary current bar to detect a magnetic field in the area of the at least two antiparallel segments.

According to another embodiment of the disclosure, an integrated current sensing device is provided. The device comprises an approximately or essentially U-shaped conductor for conducting a current to be measured, an insulation film arranged above the approximately or essentially U-shaped conductor, an electrical shielding layer arranged above at least part of the insulation film, and detection circuitry for detecting a magnetic field in the area of the approximately or essentially U-shaped conductor. The magnetic field is caused by the current to be measured. At least part of the detection circuitry is arranged above the electrical shielding layer.

According to other embodiments of the disclosure, an electrical circuit comprising an integrated current sensing device, a power converter circuit, and a method of measuring an electrical current are provided.

DRAWINGS

Aspects of the present disclosure are described, by way of example only, with reference to the following drawings, in which:

FIGS. 6A and 6B show cross-sections through further current sensing devices according to different embodiments of the disclosure.

FIGS. 7A and 7B show cross-sections through further current sensing devices according to further embodiments of the disclosure.

DETAILED DESCRIPTION

Figure 1:
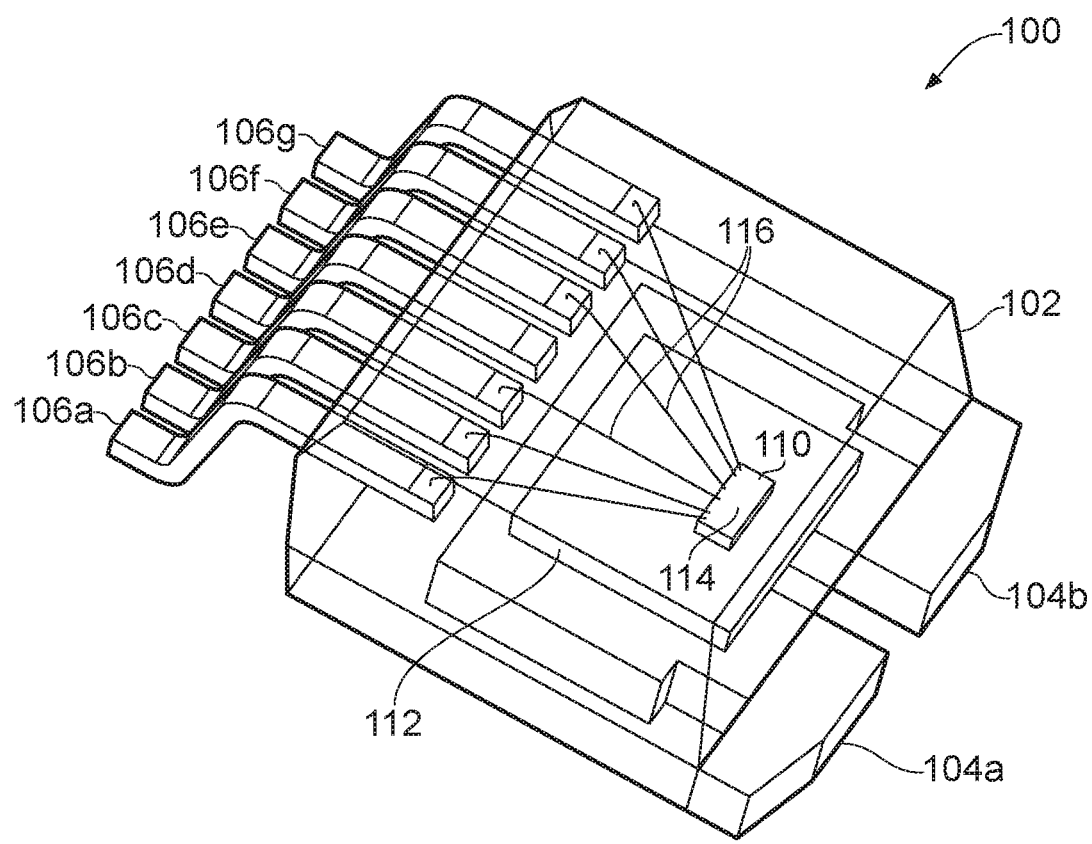
FIG. 1 shows a current sensing device according to an embodiment of the disclosure.

The present disclosure relates to current sensing devices, which sense an electrical current in an electrical conductor. Current sensing devices are used in many applications, including control circuits and power electronics. In general, the electric power consumed or provided by an electric device is computed as the product of its voltage and current, i.e., the charge and amount of electricity flowing through the conductor in a given time. Some electrical consumers, such as electrical motors, lights, pumps, and so on, operate at a fixed voltage, for example an alternating voltage of 115 V of a conventional AC outlet, or a direct voltage of 12 V provided by various power supplies. The actual power or energy uptake of such consumers can then be computed as the product of the (known) fixed voltage and current drawn by the respective consumer. Similarly, some electric power sources, such as solar cells often provide a more or less fixed output voltage, but a variable output current. Again, their actual power or energy output can be computed as the product of the (known) fixed voltage and a measured current. To effectively control electrical consumers and power sources, it is often important to know the current drawn or provided by them.

The disclosed current sensing devices make use of a magnetic sensing system. This ensures that a (primary) circuit through which an electrical current to be measured flows is electrically separated or isolated from a measurement circuit used to determine the electrical current. This is often described as galvanic separation and helps to avoid unwanted disturbances or interaction between the primary circuit and the measurement circuit. Sometimes this is also beneficial to comply with applicable safety standards. A current flowing through a primary conductor creates a magnetic field. The strength of the magnetic field corresponds, i.e., is proportional, to the amount of electricity flowing through the primary conductor, i.e., the current to be measured. This effect can be used to couple the primary circuit indirectly to a measurement circuit. Different technologies for measuring the strength of the magnetic field are known. For example, so-called magneto-resistive (MR) devices or sensor elements change their electric resistivity depending on the strength of a magnetic field surrounding the MR device. Accordingly, a measurement circuit can determine the strengths of a current flowing through a primary circuit indirectly by determining the electric resistance of one or more MR devices arranged in physical proximity to the primary circuit without any direct electrical, i.e., conductive, connection between the primary circuit and the measurement circuit.

Another effect causing an indirect coupling between two different circuits is referred to as capacitive coupling. In general, electric charges in a conductor generate an electrical field, which in turn influences the charge distribution of charge carriers in nearby conductors. In a static or approximately static situation, i.e., when the electric charges in first conductor are not moving, the net effect on a current flowing through a nearby second conductor is irrelevant. However, for rapidly changing charges or voltage potentials in a first circuit, the corresponding rapidly changing electric field generates corresponding charge redistributions in the second conductor. This effect is used in many applications. For example, many so-called near field communication (NFC) devices make use of capacitive coupling between a sending coil and a receiving coil being driven with relatively high, radiofrequency (RF) voltage signals. However, in other contexts, for example in precision measurement circuits, the capacitive coupling between a primary circuit and a measurement circuit can negatively impact the measurement result. For example, in the magnetic sensing circuits described above, the additional voltage capacitively coupled into the measurement circuit might falsify the measured resistivity of the MR devices. Also, in case a particular high-voltage is induced in the measurement circuit, sensitive components of the measurement circuits may be destroyed.

Many electronic control circuits make use of relatively fast changing voltages. For example, rather than varying a voltage or current in a proportional, analog fashion corresponding to a desired output power, pulse-width modulated (PWM) control systems switch on and off fixed output voltage at regular intervals. Depending on the respective durations of the switched on and switched off periods, the average output power of the circuit can be controlled.

Such an approach is used, for example, in many types of power converters converting an electrical current and voltage from a primary circuit to a desired voltage and/or current of a secondary circuit. In general, such converters comprise one or several chopping circuits, that chop an input current using PWM. An example of such a converter is a solar inverter used to up-convert a fixed voltage, variable direct input current provided by one or more solar panels to an alternating output current having a fixed peak voltage provided to a supply network.

The rapidly changing or chopped input voltage in the inverter is difficult to measure using conventional magnetic field sensors systems, as it is highly susceptible to capacitive coupling as detailed above. Accordingly, it is desirous to describe current sensing devices that can deal with such rapid voltage changes.

To make the disclosed sensing systems resilient to relatively fast voltage changes in the conductor, such as the repeated activation and deactivation of a supply voltage as used in PWM control circuits, an electrical shield is placed between a primary bar carrying the current to be measured and a magnetic sensing system. Preferably, the shield is configured such that it prevents or reduces eddy currents in a conductive material forming the electrical shield.

In some embodiments, a high degree of miniaturization and a high degree of automatization during manufacturing is achieved by using parts of a lead frame of a chip package to form the primary current bar. Such a current bar can be insulated from other parts of an integrated current sensing device using a polyimide film.

FIG. 1 shows a current sensing device 100 according to an embodiment of the disclosure, which is integrated into a microchip casing 102. The current sensing device 100 comprises two relatively wide connection pins 104a and 102b on one side of the casing 102 (right-hand side in FIG. 1), and several further, relatively narrow connection pins 106a to 106g on the opposite side. Each one of the connection pins 104 and 106 is formed from a lead frame, which extends into the inside of the chip casing 102.

Figure 2:
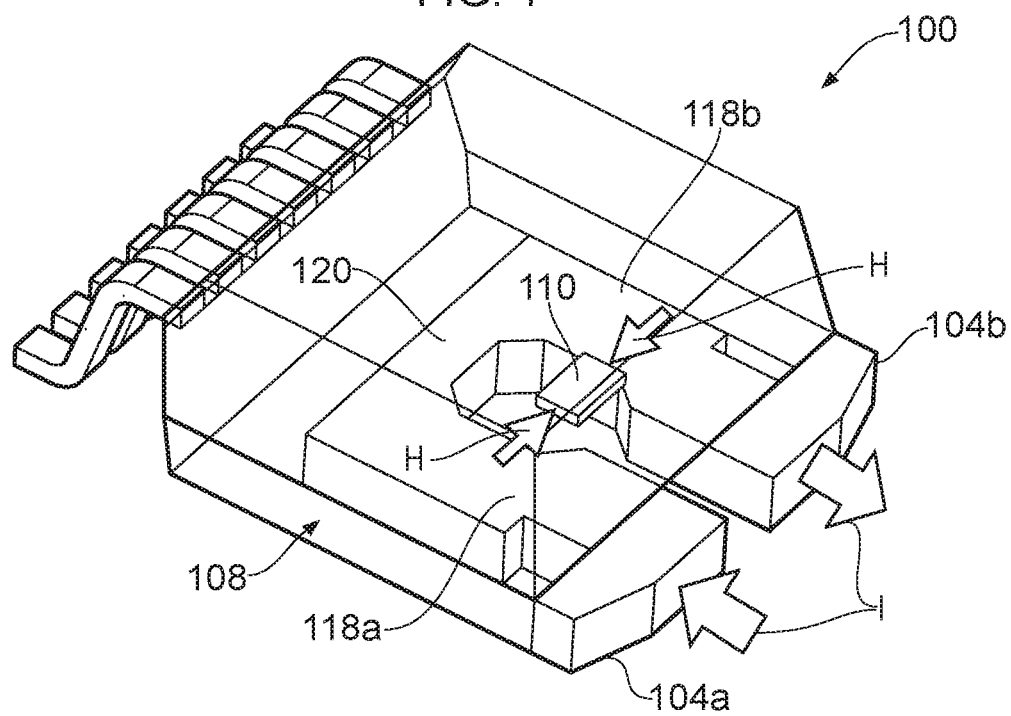
FIG. 2 shows electrical currents and magnetic fields in the current sensing device of FIG. 1.

As shown better in FIG. 2, the two connection pins 104a and 104b form the terminal ends of an approximately or essentially U-shaped primary bar 108. The approximately or essentially U-shaped primary bar 108 comprises a first leg 118a, a second leg 118b parallel to the first leg 118a, and an arc-shaped conductor 120. One end of each leg 118 ends in the two connection pins 104a and 104b, respectively. The other ends of each leg 118 are connected to each other by the arc-shaped conductor 120. The primary bar 108 is used to conduct an electrical current I to be measured through the sensing device 100. The electrical current I can flow from the first connection pin 104a in a first direction through the first leg 118a, around the arc-shaped conductor 120 and then back, in the opposite direction, through the second leg 118b to the second connection pin 104b.

The current I flowing through the U-shaped primary bar 108 generates a differential magnetic field H. More precisely, the magnetic field H around the primary bar 108 is mirror-symmetric with respect to a plane between and perpendicular to the plane in which the two legs 118a and 118b and the arc-shaped conductor 120 lie. As still shown in FIG. 2, the current I flows through the opposite legs 118a and 118b of the U-shaped primary bar 108 in opposite, antiparallel directions, causing the resulting local magnetic fields H also to be directed in opposite directions. In the depicted embodiment, a differential magnetic field sensor 110 is placed in a central area horizontally between the two legs 118a and 118b of the primary bar 108 and vertically above the plane of the primary bar 108. As explained in more detail later on, this configuration helps to compensate for any external magnetic fields, such as the Earth's natural magnetic field and magnetic fields caused by other electrical components arranged in the vicinity of the current sensing device 100, and therefore improves the accuracy of the current sensing device 100.

Referring to FIG. 1, it can be seen that the magnetic field sensor 110 is separated from the primary bar 108 by an insulation layer 112. The insulation layer 112 is made from a non-conductive material such as a ceramic substrate, epoxy resin, or a small printed circuit board, and is isolating the sensor 110 from the primary bar 108. The insulation layer 112 establishes, among others, a galvanic separation between the primary bar 108 and sensor circuitry. In the disclosed embodiment, the magnetic field sensor 110 is implemented as a semiconductor chip 114, which may comprise multiple sensor elements as well as further processing circuitry, for example an amplifier for pre-amplifying a signal detected by the sensor elements. Electrical contact points of the semiconductor chip 114 are connected using bond wires 116 with respective external connection pins 106a to 106g to connect the semiconductor chip 114 to an external circuit.

The current sensing device 100 shown in FIG. 1 provides a compact arrangement for precise measurements of static or only slowly changing currents I. As detailed earlier, it provides galvanic isolation between the primary circuit carrying the current I to be measured and any measurement circuitry. Moreover, if used in combination with a differential sensor, the influence of external magnetic fields can be eliminated to a large extent.

However, many recent applications make use of rapidly changing currents. One common example is the use of PWM controlled currents or voltages, which are used in many applications. One such application is the control of stepper motors or linear actuators, which can be positioned very precisely based on a number of control pulses provided. Similarly, in many power applications, electrical power being transferred from a primary circuit to a secondary circuit is controlled by PWM controlled chopping stages. For example, solar inverters are used to generate a desired supply or output voltage from a variable input voltage provided by one or more solar panels. These applications have in common that a voltage used to drive a current through a circuit rises and drops relatively fast. Such voltage jumps occur sometimes even without any significant current flowing through an electrical conductor, e.g. the primary bar 108 of the current sensor device 100.

As detailed above, corresponding voltages applied to the terminals 104a and 104b rise and drop relatively fast, resulting in voltage changes in the range of 5 kV/μs for typical applications. Such fast changes can result in a very significant capacitive coupling between the PWM controlled signal and the sensor 110 or any other part of the current sensing device, such as the bond wires 116 shown in FIG. 1. Voltage induced by capacitive coupling into any parts of the sensing circuitry may adversely affect the sensor performance and, in rare cases, may also lead to damage of the sensing circuitry.

Figure 3:
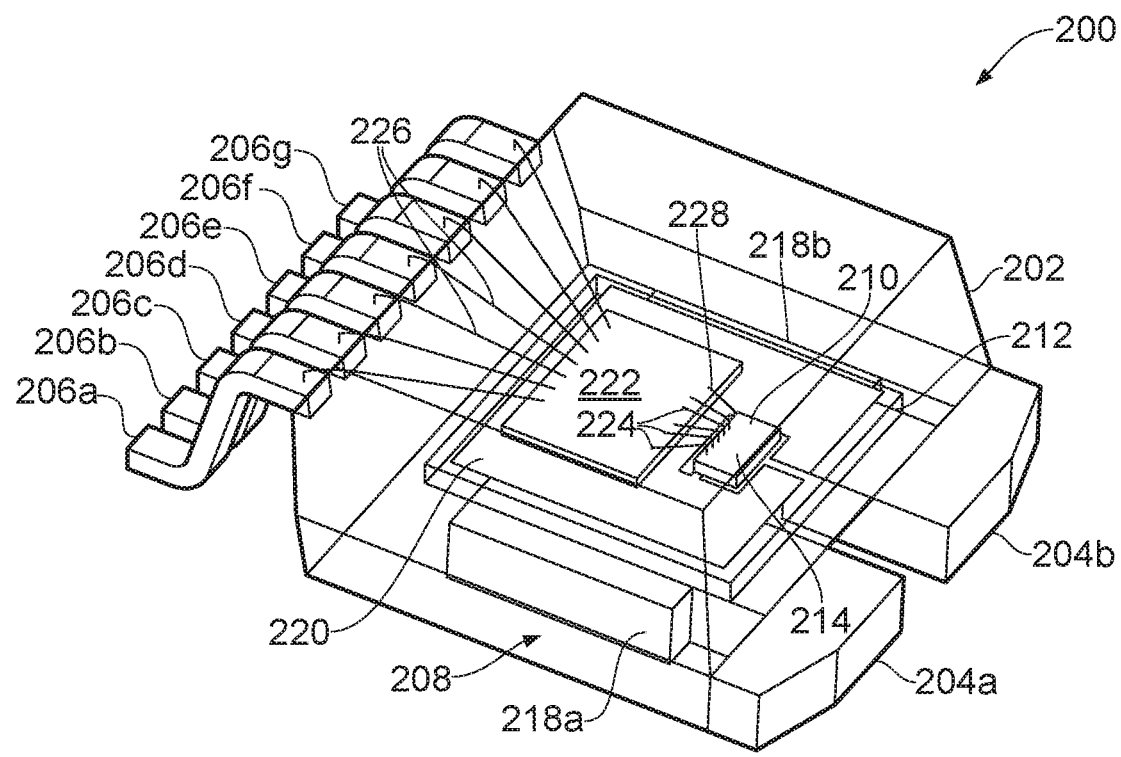
FIG. 3 shows another current sensing device according to an embodiment of the disclosure.

FIG. 3 shows a further embodiment according to the present disclosure. It shows a sensing device 200, comprising a chip casing 202, connection pins 204a, 204b, 206a to 206g, a primary bar 208 comprising legs 218a and 218b and a connecting, arc-shaped conductor (hidden in FIG. 3), a sensor 210 in form of the semiconductor chip 214 and an insulation layer 212. Most of these components correspond largely to the corresponding components of the sensing device 100 shown in FIG. 1 and will not be described again for the sake of brevity. However, as detailed below, the insulation layer 212 may be made from different materials. Moreover, the sensing device 200 comprises an electrical shield 220 and an application specific integrated circuit (ASIC) 222. The electrical shield 220 is preferably made from a conductive material, such as a metal material, a doped semiconductor material, or graphite. In the depicted embodiment, the electrical shield 220 is arranged on the upper surface of the insulation layer 212. However, it may also be placed inside the insulation layer 212. The sensor 210 as well as ASIC 222 are placed on or above the top surface of the electrical shield 220, i.e., the surface facing away from the primary bar 208.

ASIC 222 comprises processing circuitry for performing pre-amplification and other signal processing and control tasks. For this purpose, sensor 210 and ASIC 222 are coupled by a plurality of first bond wires 224. A plurality of second bond wires 226 connects the ASIC 222 with the connection pins 206a to 206g. One additional bond wire 228 connects the ASIC 222 to the electrical shield 220. For example, bond wire 228 may be connected to a predetermined electrical potential, such as electrical ground, and therefore provide a conductive discharge path for any charge stored on the electrical shield 220.

The addition of the electrical shield 220 has the beneficial effect that rapid voltage changes occurring between the terminals of the primary bar 208 are not capacitively coupled into the sensor 210, the ASIC 222, the bond wires 226 to 228 or any other part of the sensing circuitry. Instead the electrical shield 220 provides a shielding function with respect to rapid voltage changes of the primary bar 208.

As a possible variation to the embodiment described above, the two wide connection pins 204a and 204b of FIG. 3 may be replaced with a group of normal-sized connection pins 204 each. For example, the total number of external contacts 204 on the left-hand side could match the number of external contacts 206 on the opposite side of the chip casing 202 (not shown in FIG. 3). In this variation, while the outer appearance of the current sensing device complies with a standard chip package, e.g. a 16-pin SOIC or DIP package, the internal ends of the respective groups of connection pins 204, e.g. 4 pins each, are connected in parallel to respective end of the legs 218a and 218b of the primary bar 208 to enable higher currents to be split over several external connection pins.

In at least one disclosed embodiment, a substrate carrying a polyimide film is placed directly on top of the primary bar 208. The polyimide film serves as insulation layer 212. To form the electrical shield 220, a second film of sheet is deposited on top of that polyimide film or on an opposite side of the substrate. The second film or sheet is made of a metal, such as aluminum, copper or gold, or another conductive material, such as a doped semiconductor material or graphite. Optionally, an additional final passivation layer or step may be added to protect the material forming the electrical shield 220.

According to different embodiments, the electrical shield 220 is configured to prevent or reduce eddy currents from being induced into the electrical shield 220 at least in an area around the sensor 210. This further improves the performance of the sensor device 200, and also helps to prevent any damage in the relatively thin electrical shielding structure.

Figure 4:
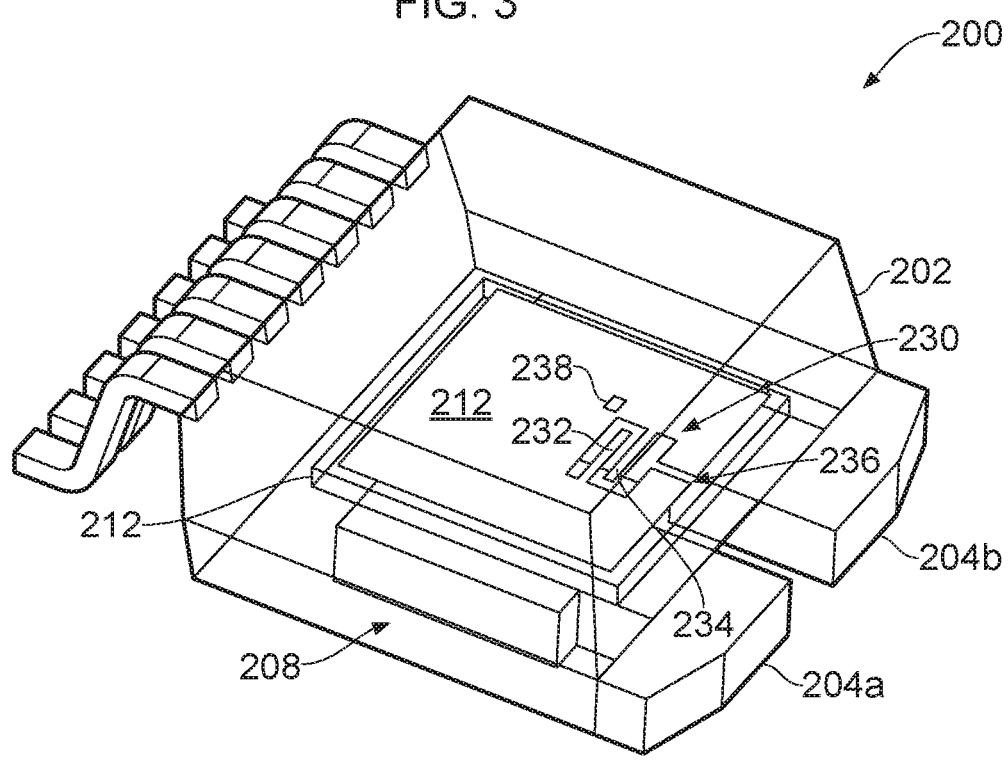
FIG. 4 shows the current sensing device of FIG. 3 with the sensing circuitry removed.

FIG. 4 shows the sensor device 200 of FIG. 3 with the sensing circuitry removed. It can be seen that the electrical shield 220 comprises a contact pad 238 for attaching the bond wire 228. The material forming the electrical shield 220 is structured in an area where the sensor chip 214 would be placed. In the depicted embodiment, a finger structure within a cut-out forms a structured area 230. This structured area 230 can inhibit eddy currents in the area where the sensor 210 is placed.

The outer circumference of the structured area 230 slightly extends beyond the outer circumference of the sensor chip 214, e.g. by 3-10% of the footprint of the microchip 214. To maintain the desired electrical shielding effect, two fingers 232 and 234 extend from opposite edges into the inner area of the structured area 230. The edge of the cut-out oriented towards the terminals 204a and 204b comprises a slit 236, which is orientated in the same direction as the gap between the two legs 218a and 218b of the U-shaped primary bar 208 ending in the terminals 204a and 204b. Described differently, seen from above, the structured area 230 forms an inverse S-shaped slit, whose base extends outwards to an edge of the electrical shield 220 at the side from which the electrical current to be measured is injected into the chip casing 202.

FIGS. 5A-5D show alternative geometric configurations for the electrical shield 220 according to different embodiments of the disclosure. In each of the embodiments, the position of the sensor chip 214 is shown with respect to a corresponding structured area of an electrical shield 220 on top of an insulation layer 212.

Figure 5A:
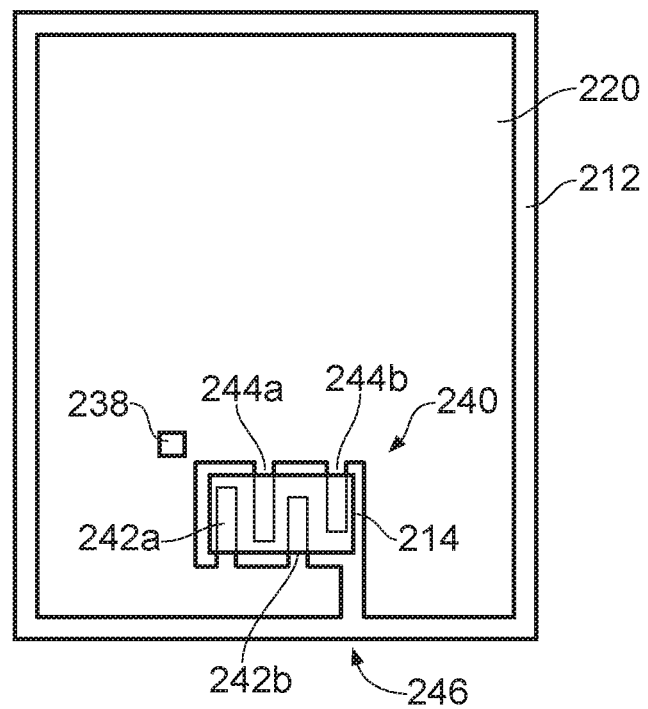
FIGS. 5A-5D show different geometric configurations for electrical shields according to different embodiments of the disclosure.

In the example shown in FIG. 5A, two fingers 242a and 242b extend from a first edge of a rectangular cut-out within a structured area 240 towards its interior. The two fingers 242a and 242b are arranged on one side, in FIG. 5A on the left side, of a slit 246 extending in a direction parallel to the two legs 218a and 218b of the primary bar 208 ending in the connection pins 204a and 204b (not shown in FIG. 5A). Two further fingers 244a and 244b are arranged on the opposite side of the structured area 240 in an alternating pattern with the fingers 242a and 242b. Similar to the embodiment shown in FIG. 4, a contact pad 238 for connecting the electrical shield 220 to a fixed reference potential is provided in proximity to the structured area 240.

Figure 5B:
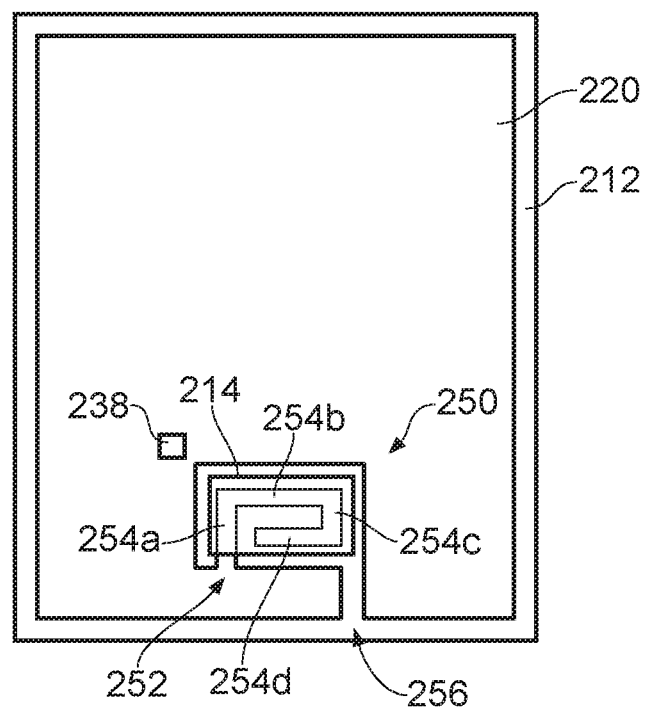

In the example shown in FIG. 5B, a single conductive finger 252 having an approximately or essentially spiral shape comprising a first segment 254a perpendicular to a first side of a structured area 250, a second segment 254b perpendicular to the first segment 254a, a third segment 254c perpendicular to the second segment 254b, and a fourth segment 254d perpendicular to the third segment 254c. The spiral finger 252 formed from the segments 254a to 254d is surrounded by corresponding gaps in the conductive material of the electrical shield 220 on all sides to prevent eddy currents. Again, a slit 256 connects the first side of the structured area 250 to the outside of the electrical shield 220 in the direction of the primary terminals 204a and 204b.

Figure 5C:
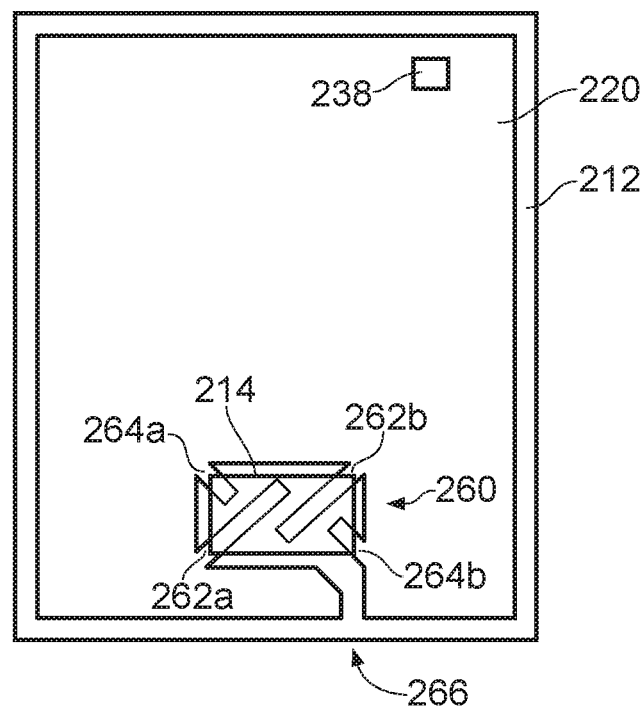

In the example shown in FIG. 5C, four conductive strips extend from the four corners of a rectangular structured area 260 at 45° angles with respect to the respective neighboring sides of the rectangle. The two fingers 262a and 262b extending from the bottom left and top right corner are longer then the two fingers 264a and 264b extending from the top left and bottom right corner as shown. Once again, a slit 266 connects the first side of the structured area 260 with the outer circumference of the electrical shield 220. Unlike before, a contact pad 238 for connecting the electrical shield to a fixed reference potential is provided close to an edge of the electrical shield, which can be used to connect it directly to an external contact pin of a sensor chip, e.g. one of the connection pins 206a-g.

Figure 5D:
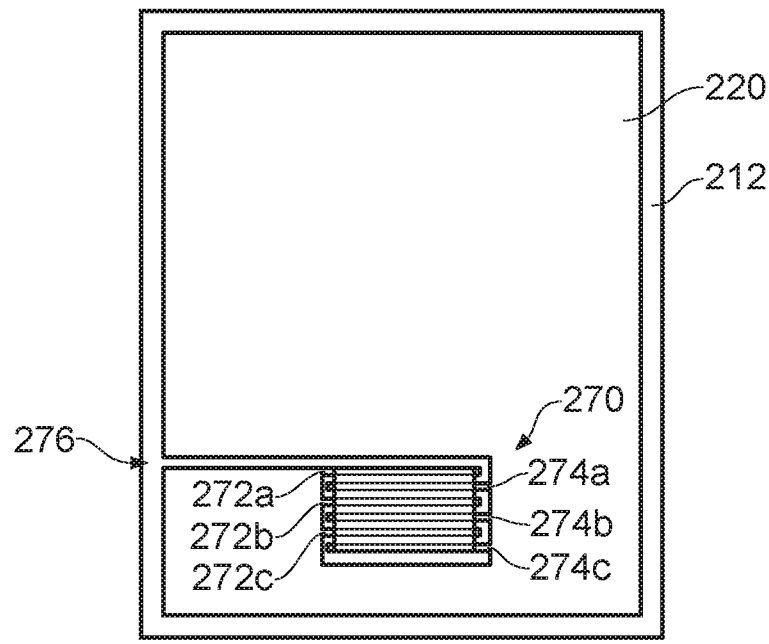

In the example shown in FIG. 5D, a total of six conductive fingers 272a-c and 274a-c extend from the left and right edges of a rectangular structured area 270, respectively. The fingers 272a-c and 274a-c extend from the left- and right-hand side edges in an alternating pattern similar to the patterns shown in FIGS. 4 and 5A. Unlike in the embodiments shown in FIGS. 4 to 5C, a slit 276 connects the left-hand side of a cut-out forming the structured area 270 with the left-hand side of the electrical shield 220. No separate connection pad is provided in this embodiment. Instead, assuming that the electrical shield is formed from a thin metal foil or sheet, a reference potential can be connected at any part of the metal surface.

Many other patterns may be used to structure the parts or all of the electrical shield 220, at least in the area where the sensor 210 is placed. For example, fewer or more conductive fingers extending from different sides of the circumference of a cut-out can be used to provide the electrical shielding and, at the same time, prevent or limit the occurrence of eddy currents. To maintain a reasonable amount of electrical shielding, in the embodiments disclosed in FIGS. 4 to 5D, at least 40%, preferably at least 50% or more, of the area corresponding to the footprint of the sensor chip 214 is covered with an electrically conductive material.

The structures shown in FIGS. 4 to 5D are manufactured using conventional semiconductor circuit processing and packaging methods. For example, the insulation layer 212 can be formed by an insulating substrate or film or a combination thereof. For example, a silicon substrate may be covered with an insulating polyimide film to provide electrical insulation. A conductive material such as copper, aluminum or gold may be deposited, for example using vapor deposition, on the insulator's top surface, i.e., the surface pointing towards the sensor and away from the primary bar. The metal layer may then be patterned using lithography and etching to form the electrical shield 220. Alternatively, the insulation layer 212 may be formed by plastic molding as part of the chip casing 202, with a separate, micro-processed metal sheet being deposited on the insulation layer 212 as electrical shield 220. Although not shown in FIG. 4, the electrical shield 220 may also be embedded within the insulation layer 212.

FIGS. 6A and 6B show cross-sections through current sensing devices 600 according to embodiments of the present disclosure. The current sensing device 600 is configured in a similar way as the current sensing device 200 described above. It comprises a conductor 618 of an otherwise not shown primary current bar, a glue layer 616, a silicon substrate 614, a polyimide film 612, and a conductive shield 620. During assembly, the polyimide film 612 forming an insulation layer is deposited on the silicon substrate 614, for example by spin-coating. Then, the conductive shield 620 is formed by vapor depositing and etching a metal material, e.g. Cu or Al, on the polyimide film 612. The completed shield assembly 630 comprising the substrate 614, the polyimide film 612, forming an insulation sub-layer, and the conductive shield structure 620, forming a shielding sub-layer, is then glued to the primary current bar using a non-conductive die attachment glue as shown in FIG. 6A.

Optionally, as shown in FIG. 6B, an additional passivation layer 622 is placed over the conductive shield 620 and forms part of the shield assembly 630. The passivation layer 622 may comprise an electrically insulating oxide or nitride material, such as Al2O3 or SixNy, SU8, a polymer, such as polyimide, or a photoresist, such as SU8. Using the same material as for the insulation layer, i.e., a second polyimide film, or a material having a similar thermal expansion coefficient reduces mechanical stress and unwanted mixing with other materials. The passivation layer 622 comprises an opening 624. The opening 624 may be formed by generally known techniques, such as lithography and/or etching of the passivation layer 622. The opening may be used to bond a wire to the conductive shield 620, e.g. for connecting the electrical shield 620 to a predefined voltage potential, such as electrical ground. The passivation layer 622 and/or the opening 624 may be formed before or after gluing the shield assembly 630 to the conductor 618 of the primary current bar.

FIGS. 7A and 7B show cross-sections through a current sensing devices 700 according to other embodiments of the disclosure. Similar to the current sensing devices 600, the current sensing devices 700 comprise a conductor 718 of an otherwise not shown primary current bar, a glue layer 716, a polyimide film 712, and a silicon substrate 714. The arrangement of the above layers is slightly different in that the polyimide film 712 is placed on the bottom surface of the silicon substrate 714, with respect to the stacking direction shown in FIG. 7A. Also, rather than depositing a conductive metal material on top of the silicon substrates 714, an area 720 close to the surface of the silicon substrate 714 is doped using an appropriate dopant. The dopant concentration may be selected to achieve a desired electrical conductivity of the doped area 720, which greatly reduces the formation of eddy currents. For example, the conductivity of the doped area 720 may be less than $1/(\mu Ohm*m)$ or 106 S/m. Accordingly, the doped area 720 acts as electrical shield. In the embodiment shown in FIG. 7A, the doped area 720 extends from the top surface into the silicon substrate 714 for about 2 μm. As shown, the doped area 720 may be formed only in a desired area and may not extend over the entire surface of the silicon substrate 714.

The current sensing device 700 of FIG. 7A further comprises an electrical contact 738, which may be formed by metallization of the small part of the upper surface of the doped area 720. The contact 738 may be used to connect the doped area 720 to a fixed reference potential, such as electrical ground. The shield assembly 730 comprising the silicon substrate 714 with the doped area 720, the contact 738 and the insulating polyimide film 712 may be preassembled and then glued using a nonconductive die attachment glue to the primary current bar. Unlike in the embodiment shown in FIGS. 6A and 6B, the shield assembly is glued with the polyimide film 712 facing down towards the conductor 718.

Similar to the structure shown in FIG. 6B, the shield assembly 730 may be covered with an additional passivation layer 722 as shown in FIG. 7B. The passivation layer 722 has an opening 724 in the area of the electrical contact 738.

The various shielding structures disclosed above with respect to FIGS. 3 to 7B are useful for preventing a capacitive coupling between a primary bar and sensor circuitry.

Figure 8:
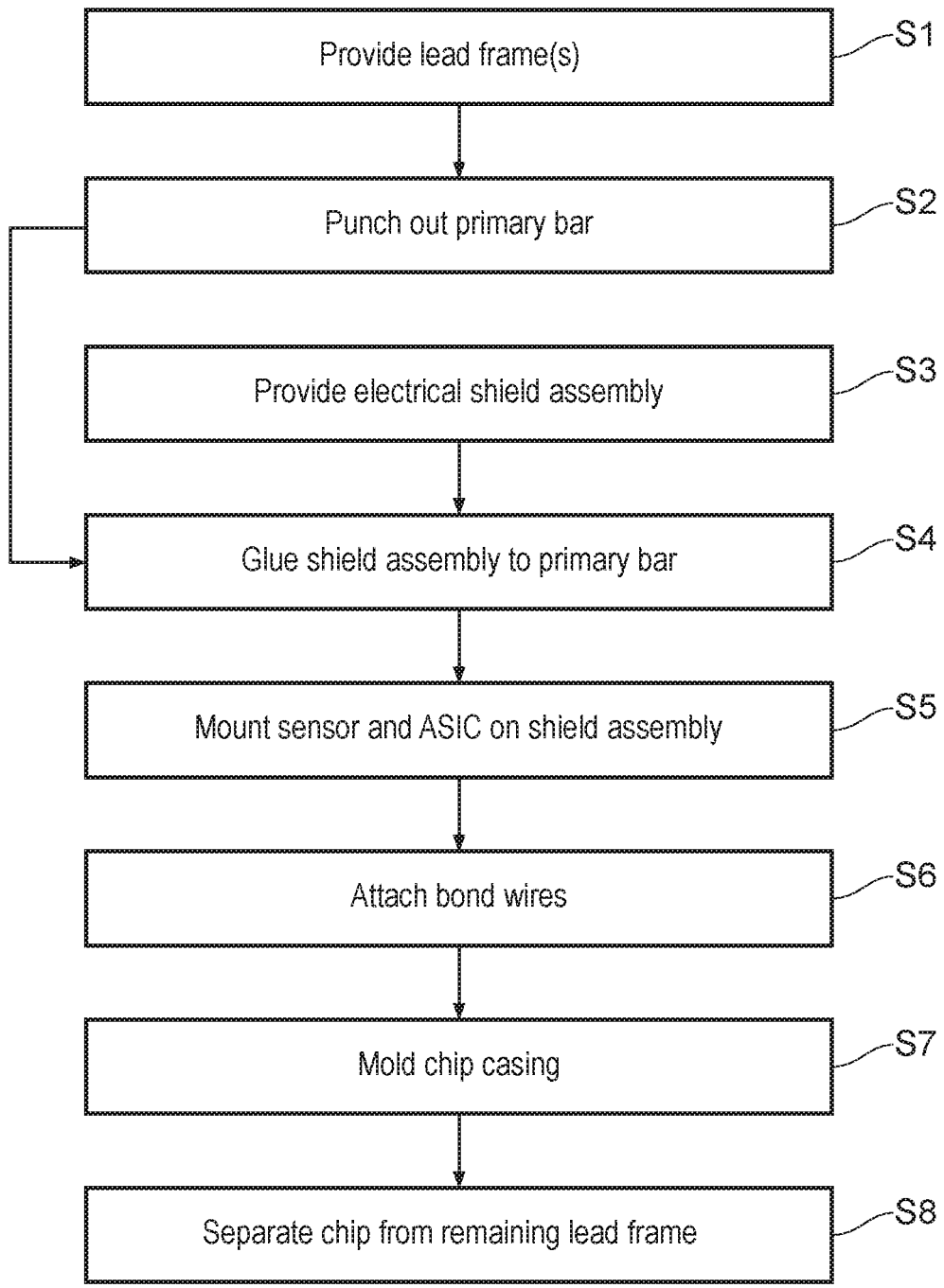
FIG. 8 shows steps of a method for manufacturing an integrated current sensor according to an embodiment of the disclosure.

Next, steps of a method for manufacturing an integrated current sensor according to an embodiment of the disclosure are described with respect to the flow diagram of FIG. 8. While the steps are shown and described in a particular order, this sequence is not meant to be limiting. For example, the shield assembly could be prepared before the other steps of the described method are carried out.

In a first step S1, a long strip of lead frames, still connected to each other, is provided. This may comprise the provision of a uniform strip of copper, or the provision of some preprocessed base lead frames, e.g. pre-punched pieces of metal. The metal material of the lead frames will later form the connection terminals of the formed integrated circuit device, such as the terminals 204 and 206, as well as the remainder of the primary bar 208, i.e., the legs 218 and arc-shaped conductor 220. At this stage, the metal material of the lead frame has uniform thickness.

In a second step S2, for each individual lead frame, one part, e.g. the left hand part, later forming the contacts 206 is separated from an opposite part, e.g. the right hand part of the lead frame, later forming the primary bar 208 and contacts 204 by punching. In the described process, in addition to the physical separation, the metal material of the left-hand part is also flattened by stamping. As a result, the relatively thin terminals 106a to 106g shown in FIG. 3 may be formed on the left-hand side, while the contacts 204a and 204b and U-shaped conductor forming the primary bar 208 remain thicker, allowing a relatively high current I to flow through the completed sensor device. For example, the primary bar may have a thickness of 0.2 mm.

In a third step S3, one or several shield assemblies are formed. For this purpose, a silicon or other wafer is first spin-coated with polyimide forming an insulating polyimide film on one surface of the silicon substrate. As shown in FIGS. 6A to 7B, the same surface or an opposite surface of the silicon substrate is than coated and/or patterned to form one or several conductive shield structures, e.g. one of the conductive shield structures described above and shown in FIGS. 4 to 5D. Using a conventional wafer, a relatively large number of conductive shields structures can be formed at once using the steps described above. These are then separated into individual shield assemblies, e.g. assemblies 630 or 730, by cutting the structured, coated and optionally passivated wafer into corresponding segments.

In a fourth step S4, the prepared shield assembly is glued to the right-hand side of the lead frame to insulate the primary bar 208 from the rest of the integrated circuit device and prevent capacitive coupling between the primary bar 208 and the sensing circuitry mounted in step S5 on top of the shield assembly. As shown in FIGS. 3 to 5D, the shield assembly is preferably arranged in a central area between two legs of a U-shaped conductor.

In a fifth step S5, a magnetic field sensor 210 and, optionally, an ASIC 222 or other processing circuitry is placed on top of the shield assembly. Typically, both the magnetic field sensor 210 as well as the ASIC 222 are formed as separate semiconductor chips using conventional semiconductor techniques. As such, techniques known for chip-on-chip mounting can be used to mount the sensor chip 214 and ASIC 222 on top of the shield assembly 630 or 730, respectively.

In a sixth step S6, the electronic components are connected to each other using conventional connection techniques. For example, interface circuitry of the ASIC 222 can be connected using bond wires 224 to the terminals 206 on the left-hand side of the lead frame. In addition, electrical connections between the ASIC 222 and the sensor chip 214 may be formed using additional bond wires 226. Moreover, a contact pad 238 of the electrical shield 220 may be bonded either to one of the terminals 206 directly or indirectly via the ASIC 222 using a further bond wire 228.

In a seventh step S7, the primary bar 208, the shield assembly 630 or 730, the magnetic field magnetic field sensor 210, the ASIC 222 as well as the bond wires 224-228 and internal ends of the terminals 204 and 206 are molded over to a form chip casing 202.

In an eight, optional step S8, the individual integrated sensor devices are separated from each other by punching the formed devices from the strip of lead frames. In this way, the exterior contact pads of the connection pins 204 and 206 are formed.

As indicated before, the accuracy of the above disclosed sensor circuits can be further improved if they are combined with a differential sensor design as described below.

Figure 9:
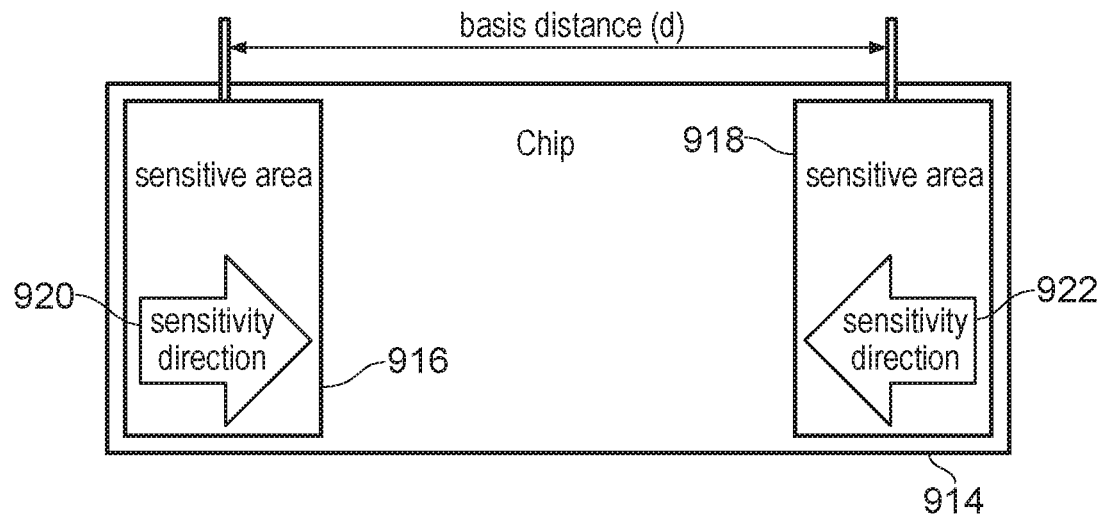
FIG. 9 shows a schematic representation of a differential sensor design according to an embodiment of the disclosure.

FIG. 9 shows schematically a differential sensor design. A sensor chip 914 comprises two different, magneto-sensitive areas 916 and 918. Due to the way these sensitive areas 916 and 918 are formed, they are responsive to magnetic fields orientated in different, opposite directions, as indicated by arrows 920 and 922, respectively. The two sensing areas 916 and 918 are placed a distance d apart, which is aligned with the physical configuration of the primary bar 908 of the sensor device, so that the first sensing area 916 is placed closer to a first leg of the primary bar 908 and the second sensing area 918 is placed closer to a second leg of the primary bar 908. For example, the center of the sensing area 916 could be placed close to an inner edge of the left leg 218a of the primary bar 208 of FIGS. 3 and 4 extending into the first terminal 204a, and the second sensing area 918 could be placed close to an opposite, inner edge of the right leg 218b of the primary bar 208 extending to the second terminal 204b.

In the U-shaped or semi-circular configuration of the primary bar 208 shown in FIG. 2, the current I flows in opposite directions through the corresponding legs 218. Accordingly, the magnetic field caused by the current flowing through said legs is also orientated in opposite directions which, in the example given, correspond to the sensitivity directions indicated by arrows 920 and 922. As such, the sensor signals of the first sensor area 916 and the second sensor area 918 add up to effectively double the sensor signal. In contrast, any ambient magnetic field or other source of disturbance will usually affect both sensitive areas 916 and 918 in the same way. As the sensitive areas 916 and 918 have opposite sensitivity direction, the net effect of any such disturbance signals will be zero, i.e., cancelled out.

Figure 10:
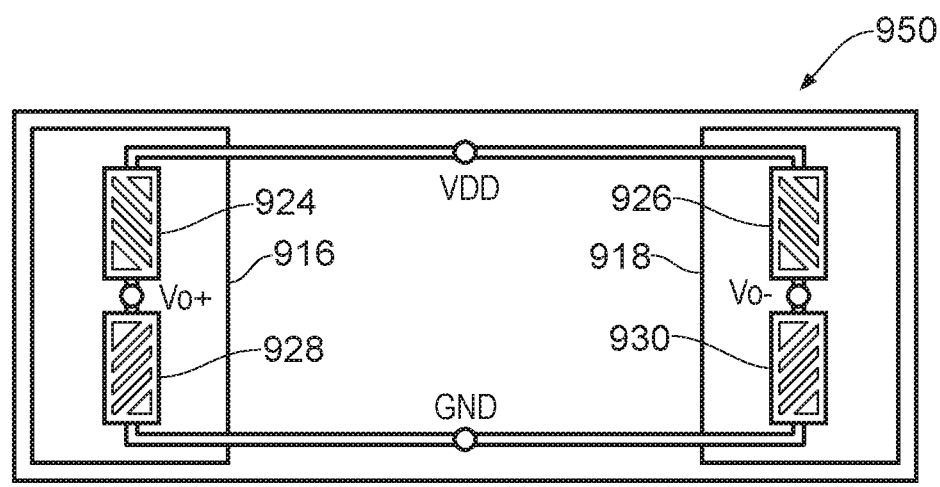
FIG. 10 shows a basic architecture for implementing the differential sensor design shown in FIG. 9 according to an embodiment of the disclosure.

FIG. 10 shows a basic architecture for implementing the differential sensor design shown in FIG. 9. To achieve the desired sensitivity direction, four different sensor elements 924, 926, 928 and 930 are arranged in an electrical Wheatstone bridge 950. Different branches of the bridge 950 connect a supply voltage VDD and electrical ground GND with a positive and negative sensing terminal Vo+ and Vo−. The sensor elements 924, 926, 928 and 930 may be anisotropic magnetoresistance, AMR, sensor element or a tunnel magnetoresistance, TMR, sensor elements. Each sensor elements 924, 926, 928 and 930 arranged in each of the four branches has a different magnetic configuration. In the described embodiment, the sensor elements 924, 926, 928 and 930 are magnetoresistive and in particular each comprise an anisotropic magneto-resistive element. The different configurations of the sensor elements 924, 926, 928 and 930 can be achieved by providing different barber pole structures within each of the sensor elements 924, 926, 928 and 930, which force an electrical current flowing through the magneto-resistive material to flow at an angle of 45 degrees with respect to the magnetization direction of the magneto-resistive material. Depending on the magnetization direction of the magneto-resistive material and orientation of the barber poles, sensor elements 924, 926, 928 and 930 with four different response characteristics can be chosen as desired to achieve the given sensitivity direction, for example as shown by arrows 920 and 922 of FIG. 9.

Figure 11:
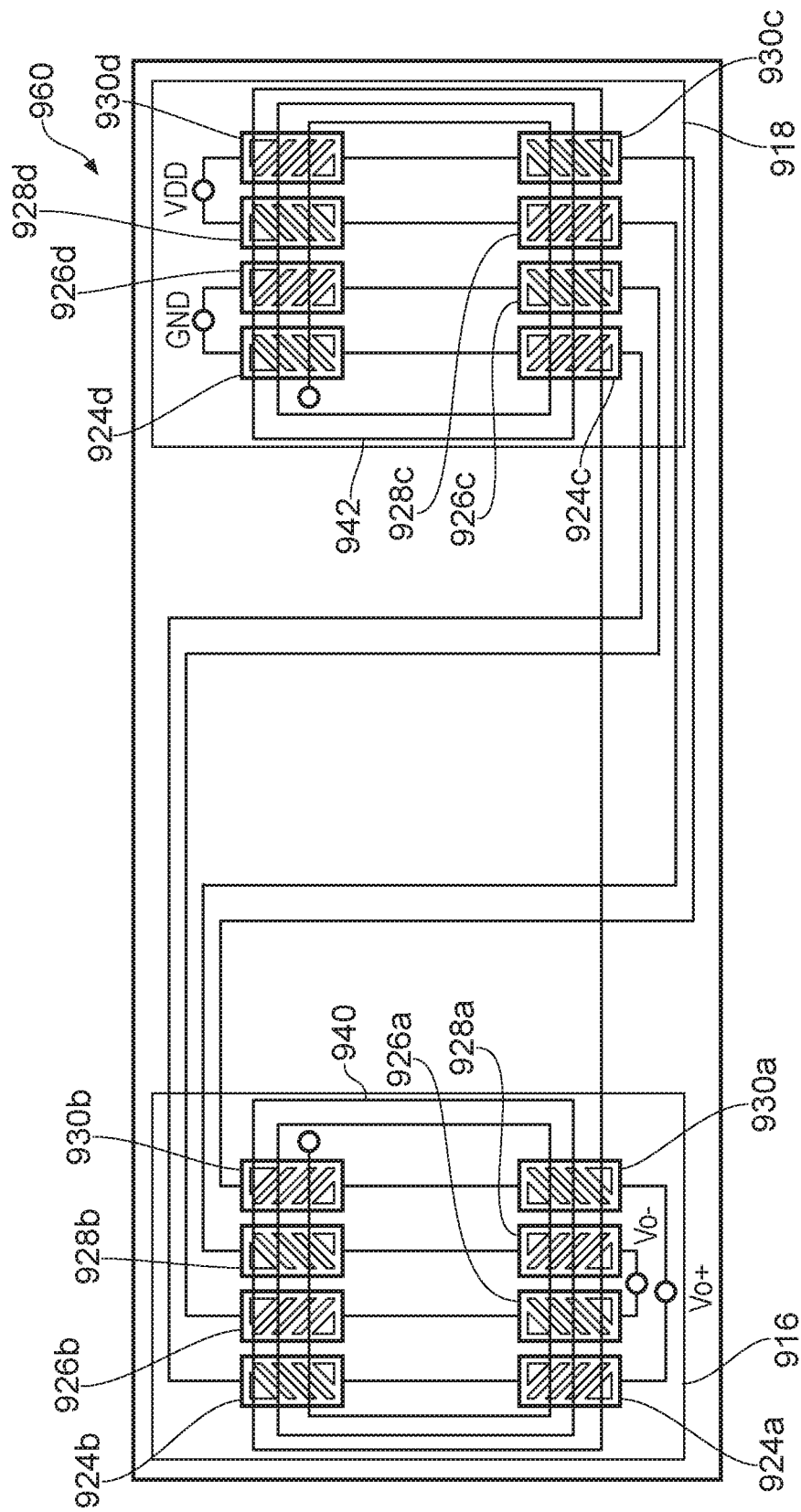
FIG. 11 shows a further architecture for implementing the differential sensor design shown in FIG. 9 according to another embodiment of the disclosure.

A further optimization of a differential field sensor is shown in FIG. 11. Instead of four sensor elements 924 to 930, a total of 16 sensor elements 924a-d, 926a-d, 928a d and 930a-d are used, which are arranged as shown in FIG. 11. The sensor elements 924a-d, 926a-d, 928a-d and 930a-d are AMR sensor elements, and have a predefined, but changeable magnetization direction. Together, the sensor elements 924a-d, 926a-d, 928a-d and 930a-d form a Wheatstone bridge 960, wherein each one of the four outer branches of the bridge comprises a group of four series connected sensor elements 924a-d, 926a-d, 928a-d or 930a-d having the same magnetic configuration. For example, the branch between the supply voltage VDD and the positive output voltage Vo+ comprises sensor elements 930a-d. Two of these sensor elements 930a and 930b are placed in a first sensitive area 916 co-located with a first coil 940, and the remaining sensor elements 930c and 930d are placed in a second sensitive area 918 co-located with a second coil 942. By feeding a pulse current through the two electrically coupled coils 940 and 942, the magnetization of all sensor elements can be changed, leading to a change in their resistivity. By alternatingly sending positive and negative currents through the two coils 940 and 942, the intrinsic magnetic field of the respective sensor elements in the two sensing areas 916 and 918 can be electrically reversed or flipped at regular intervals. The regular inversion of the magnetization cancels out any offsets in the processing circuitry. This also helps to compensate potential manufacturing variations associated with each magnetic sensor configuration. Further details on the manufacturing, configuration and operation of differential magnetic field sensors may be found in published German patent application DE 197 22 834 A1 of Dr. Fritz DETTMANN and Uwe LOREIT, the content of which is incorporated by reference herein in its entirety.

For other sensor types, such as GMR or TMR sensor elements, instead of using magnetizing coils, the sensitive direction can be determined by a pinned layer of the respective sensor.

The configuration shown in FIG. 11 thus provides in a further improvement in sensitivity and noise reduction of the described sensor architecture. In combination, the approximately or essentially U-shaped primary bar, the electrical shielding structure and the differential sensor design disclosed herein lead to a great improvement in sensitivity, resilience to ambient disturbances and robustness with respect to sudden changes of the electrical field within the primary bar of the disclosed current sensing device.

While above description fully and completely describes various useful embodiments, the disclosure and protective scope shall not be limited by the disclosed embodiments. For example, while different aspects of various embodiments of the disclosure have been described above, the skilled person will understand that these aspects may also be combined in different manners to achieve further embodiments. For example, the various shielding patterns, layer arrangements and manufacturing techniques disclosed herein may be combined to derive further embodiments. Also, while certain applications, such as power converters and motor controllers, have been identified, the skilled person will understand that the claimed devices, circuits and systems may be used in a much wider range of applications without deporting from the scope of the disclosure.

Some further embodiments of the disclosure are briefly described in the following clauses:

Clause 1. A chip sensor package, comprising:
a lead frame, comprising a metal trace for carrying a current from a first terminal to a second terminal, the metal trace comprising a first conductive section for carrying the current in a first direction and a second conductive section for carrying the current in a second direction, the second direction being opposite to the first direction;
a differential magnetic field sensor placed in a layer of the sensor package above the lead frame, the differential magnetic field sensor comprising a first sensing area associated with the first conductive section and a second sensing area associated with the second conductive section; and
an electrical shield placed between the lead frame and the differential magnetic field sensor.

Clause 2. The chip sensor package of clause 1, further comprising:
an insulation layer, the insulation layer being arranged between the lead frame and the electrical shield.

Clause 3. The chip sensor package of clause 2, wherein the insulation layer further comprises a substrate covered with an insulating film, the insulating film being arranged between the lead frame and the electrical shield.

Clause 4. The chip sensor package of clause 3, wherein the substrate comprises at least one of a silicon, a semiconductor, and an insulating substrate.

Clause 5. The chip sensor package of clause 3 or 4, wherein the insulating film comprises a polyimide film.

Clause 6. The chip sensor package of one of clauses 1 to 5, wherein the electrical shield is connected to a third terminal of the lead frame configured to provide a reference voltage.

Clause 7. The chip sensor package of clause 6, wherein the reference voltage is electrical ground.

Clause 8. The chip sensor package of one of clauses 1 to 7, further comprising an application specific integrated circuit, ASIC, the ASIC being connected to the differential magnetic field sensor and to at least one further terminal of the lead frame.

Clause 9. The chip sensor package of one of clauses 1 to 8, wherein the differential magnetic field sensor comprises at least one of an anisotropic magnetoresistance, AMR, sensor element, a giant magnetoresistance, GMR, sensor element, or a tunnel magnetoresistance, TMR, sensor element.

Clause 10. The chip sensor package of one of clauses 1 to 9, wherein the lead frame comprises a plurality of first pins extending out of the chip sensor package, and a plurality of second pins extending out of the chip sensor package, each one of the first pins being connected with the first terminal, and each one of the second pins being connected with the second terminal of the metal trace.

Clause 11. The chip sensor package of any one of clauses 1 to 10, wherein the electrical shield comprises a conductive material, the conductive material being structured at least in an area in which the differential magnetic field sensor is placed, so as to prevent the formation of eddy currents in said area of the conductive material.

Clause 12. A method of manufacturing an integrated sensor device, comprising:
providing a primary current bar in a base layer, the primary current bar having at least two antiparallel segments;
providing an insulation layer comprising an insulating film, the insulation layer being arranged above the base layer in a stacking direction;
providing an electrical shield in a shielding layer, the shielding layer being arranged above the base layer and the insulation layer in the stacking direction, the electrical shield being isolated from the primary current bar by the insulation film; and
providing a differential magnetic field sensor in a sensing layer, the sensing layer being arranged above the base layer, the insulation layer and the shielding layer in the stacking direction, the differential magnetic field sensor being arranged on the opposite side of the electrical shield with respect to the primary current bar to detect a magnetic field in the area of the at least two antiparallel segments.

Clause 13. The method of clause 12, wherein insulating film comprises a polyimide film.

Clause 14. The method of clause 12 or 13, wherein the insulation layer further comprises a substrate having opposite first and second surfaces, the insulating film being provided on the first surface of a substrate.

Clause 15. The method of clause 14, wherein the step of providing the electrical shield comprises structuring at least part of the second surface of the substrate to form a conductive area on the substrate, the conductive area forming at least part of the electrical shied.

Clause 16. The method of any one of clauses 12 to 15, further comprising gluing the insulation film to the primary current bar.

Clause 17. The method of clause 14, further comprising gluing the second surface of the substrate to the primary current bar.

Clause 18. The method of any one of clauses 12 to 14 or 17 wherein the electrical shield is provided on the insulation film.

Clause 19. The method any one of clauses 12 to 18, further comprising:
providing a passivation layer, the passivation layer being arranged between electrical shield and the differential magnetic field sensor.

Clause 20. The method of clause 19, further comprising:
providing at least one opening for contacting the electrical shield in the passivation layer.

Clause 21. The method of any one of clauses 12 to 20, further comprising
molding over at least the primary current bar, the insulation film, the electrical shield and the differential magnetic field sensor and forming a chip housing of the integrated sensor device.

Clause 22. An integrated current sensing device, comprising:
an approximately U-shaped conductor for conducting a current to be measured;
an insulation film arranged above the approximately U-shaped conductor;
an electrical shielding layer arranged within or above at least part of the insulation layer; and
detection circuitry for detecting a magnetic field in the area of the approximately U-shaped conductor, the magnetic field being caused by the current to be measured, at least part of the detection circuitry being arranged above the electrical shielding layer.

Clause 23. The device of clause 22, wherein the insulating film comprising a polyimide film.

Clause 24. The device of clause 22 or 23, wherein the electrical shielding layer comprises at least one of a conductive film, foil or sheet attached to a top surface of the insulation layer.

Clause 25. The device of any one of clauses 22 to 24, wherein the electrical shielding layer is configured to reduce the occurrence of eddy currents within the electrical shielding layer.

Clause 26. The device of any one of clauses 22 to 25, wherein the electrical shielding layer comprises a patterned, partially conductive area in an area corresponding to the detection circuitry.

Clause 27. The device of clause 26, wherein the patterned, partially conductive area comprises a metal structure comprising at least one of a cut-out, a slit and a conductive finger.

Clause 28. The device of any one of clauses 22 to 26, wherein the electrical shielding layer comprises a low-conductivity material having a conductivity of less than $10^6$ S/m.

Clause 29. The device of clause 28, wherein the low-conductivity material comprises at least one of graphite and a doped semiconductor material.

Clause 30. The device of any one of clauses 22 to 28, further comprising a lead frame, wherein the approximately U-shaped conductor is formed by a part of the lead frame.

Clause 31. The device of any one of clauses 22 to 30, wherein the approximately U-shaped conductor comprises a first leg, a second leg arranged in parallel to the first leg and an connection part connecting a first end of the first leg with a first end of the second leg, wherein a second end of the first leg and a second end of the second leg form an input terminal and an output terminal for the current to be measured, respectively.

Clause 32. The device of any one of clauses 22 to 31, wherein the detection circuitry comprises a differential magnetic field sensor having a first and a second sensing area, the approximately U-shaped conductor comprises a first and a second leg, wherein the first and second sensing areas are arranged in a sensing plane above a conductor plane comprising the first and the second leg, respectively, and wherein the first sensing area is placed closer to the first leg than the second leg and the second sensing area is placed closer to the second leg than the first leg.

Clause 33. The device of any one of clauses 22 to 32, wherein the detection circuitry further comprises a processing circuit coupled to the differential magnetic field sensor.

Clause 34. The device of any one of clauses 22 to 33, wherein the electrical shielding layer is connected to an electrical reference potential.

Clause 35. An electrical circuit, comprising:
a controller configured to provide a pulse width modulated, PWM, voltage;
one of an electrical source or electrical load configured to provide or receive an electrical current controlled by the PWM voltage; and
an integrated current sensing device according to any one of the clauses 22 to 34, the integrated current sensing device being configured to determine a size of the electrical current Clause 36. A power converter circuit comprising the electrical circuit of clause 35.

Clause 37. A method of measuring an electrical current using an integrated sensor device shielded from capacitive coupling by a conductive shield, the method comprising:
generating a differential magnetic field by conducting the electrical current along a curved conductive path arranged on a first side of the conductive shield;
dampening any eddy currents induced in the conductive shield by interrupting or attenuating circular eddy currents in the conductive shield;
measuring a differential magnetic field on a second side of the conductive shield; and
determining an electrical current based on the measured differential magnetic field.

Clause 38. The method of clause 37, wherein the electrical current is driven by a pulse width modulated electrical supply voltage.

APPLICATIONS

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A chip sensor package, comprising:
   a lead frame, comprising a metal trace for carrying a current from a first terminal to a second terminal, the metal trace comprising a first conductive section for carrying the current in a first direction and a second conductive section for carrying the current in a second direction, the second direction being opposite to the first direction;
   a differential magnetic field sensor placed in a layer of the sensor package above the lead frame, the differential magnetic field sensor comprising a first sensing area associated with the first conductive section and a second sensing area associated with the second conductive section; and
   an electrical shield placed between the lead frame and the differential magnetic field sensor, the electric shield including a structured area having a conductive arm extending in a cut-out and configured to reduce formation of eddy currents in an area around the differential magnetic field sensor and a slit that connects the structured area with an outer edge of the electric shield,
   wherein the differential magnetic field sensor at least partially overlaps the structured area, and
   wherein the structured area extends beyond an outer circumference of the differential magnetic field sensor by 3% to 10% of a footprint of the differential magnetic field sensor.

2. The chip sensor package of claim 1, further comprising: a substrate covered with an insulating film, the insulating film being arranged between the lead frame and the electrical shield.

3. The chip sensor package of claim 1, wherein the electrical shield is connected to a third terminal of the lead frame configured to provide a reference voltage.

4. The chip sensor package of claim 1, further comprising an application specific integrated circuit (ASIC), the ASIC being connected to the differential magnetic field sensor and to at least one further terminal of the lead frame.

5. The chip sensor package of claim 1, wherein the differential magnetic field sensor comprises at least one of an anisotropic magnetoresistance (AMR) sensor element, a giant magnetoresistance (GMR) sensor element, or a tunnel magnetoresistance (TMR) sensor element.

6. The chip sensor package of claim 1, wherein the structured area comprises a plurality of conductive fingers including the conductive finger, and at least 40% of an area of the structured area that corresponds to the foot print of the differential magnetic field sensor is covered by the plurality of conductive fingers.

7. A method of manufacturing an integrated sensor device, comprising:
   providing a primary current bar in a base layer, the primary current bar having at least two antiparallel segments;
   providing an insulation layer comprising an insulating film, the insulation layer being arranged above the base layer in a stacking direction;
   providing an electrical shield in a shielding layer, the shielding layer being arranged above the base layer and the insulation layer in the stacking direction, the electrical shield being isolated from the primary current bar by the insulation film, the electric shield including a structured area and a slit that connects the structured area with an outer edge of the shielding layer; and providing a differential magnetic field sensor in a sensing layer, the sensing layer being arranged above the base layer, the insulation layer and the shielding layer in the stacking direction, the differential magnetic field sensor being arranged on an opposite side of the electrical shield with respect to the primary current bar to detect a magnetic field in the area of the at least two antiparallel segments, the differential magnetic field sensor at least partially overlapping the structured area, wherein the structured area is configured to reduce formation of eddy currents in an area around the differential magnetic field sensor, and wherein the structured area has a conductive arm extending in a cut-out, and the structured area extends beyond an outer circumference of the differential magnetic field sensor by 3% to 10% of a footprint of the differential magnetic field sensor.

8. The method of claim 7, wherein the insulation layer further comprises a substrate having opposite first and second surfaces, the insulating film comprising a polyimide film provided on the first surface of a substrate.

9. The method of claim 8, wherein the electrical shield is provided on the insulation film, and wherein the method further comprises gluing the second surface of the substrate to the primary current bar.

10. The method of claim 8, wherein the step of providing the electrical shield comprises structuring at least part of a second surface of the substrate to form a conductive area on the substrate, the conductive area forming at least part of the electrical shied.

11. The method of claim 10, further comprising gluing the insulation film arranged on the first surface of the substrate to the primary current bar.

12. The method of claim 7, further comprising:
providing a passivation layer, the passivation layer being arranged between the electrical shield and the differential magnetic field sensor, the passivation layer comprising at least one opening for contacting the electrical shield.

13. An integrated current sensing device, comprising:
an approximately U-shaped conductor for conducting a current to be measured;
an insulation film arranged above the approximately U-shaped conductor;
an electrical shielding layer arranged above at least part of the insulation film, the electrical shielding layer including a structured area and a slit that connects the structured area with an outer edge of the electric shielding layer; and
detection circuitry for detecting a magnetic field in the area of the approximately U-shaped conductor, the magnetic field being caused by the current to be measured, at least part of the detection circuitry being arranged above the structured area of the electrical shielding layer,
wherein the structured area is configured to reduce formation of eddy currents in an area around the detection circuitry, and
wherein the structured area has a conductive arm extending in a cut-out, and the structured area extends beyond an outer circumference of the detection circuitry by 3% to 10% of a footprint of the detection circuitry.

14. The device of claim 13, wherein the slit connects to the cut-out of the structured area.

15. The device of claim 14, wherein the slit is positioned outside of the footprint of the detection circuitry.

16. The device of claim 13, wherein the electrical shielding layer comprises a low-conductivity material having a conductivity of less than $10^6$ S/m.

17. The device of claim 16, wherein the low-conductivity material comprises at least one of graphite and a doped semiconductor material.

18. The device of claim 13, further comprising a lead frame, wherein the approximately U-shaped conductor is formed by a part of the lead frame.

19. The device of claim 13, wherein the detection circuitry comprises a differential magnetic field sensor having a first and a second sensing area, the approximately U-shaped conductor comprises a first and a second leg, wherein the first and second sensing areas are arranged in a sensing plane above a conductor plane comprising the first and the second leg, respectively, and wherein the first sensing area is placed closer to the first leg than the second leg and the second sensing area is placed closer to the second leg than the first leg.

20. The chip sensor package of claim 1, wherein at least 40% of an area of the structured area that corresponds to the foot print of the differential magnetic field sensor is covered by an electrically conductive material.

* * * * *